(12) United States Patent
Kastalsky

(10) Patent No.: US 7,851,784 B2
(45) Date of Patent: Dec. 14, 2010

(54) NANOTUBE ARRAY ELECTRONIC DEVICES

(75) Inventor: Alexander Kastalsky, Wayside, NJ (US)

(73) Assignee: Nano-Electronic And Photonic Devices And Circuits, LLC, Bridgeport, PA (US)

( * ) Notice: Subject to any disclaimer, the term of this patent is extended or adjusted under 35 U.S.C. 154(b) by 616 days.

(21) Appl. No.: 11/705,577

(22) Filed: Feb. 13, 2007

(65) Prior Publication Data

US 2008/0191189 A1    Aug. 14, 2008

(51) Int. Cl.
*H01L 31/00* (2006.01)
(52) U.S. Cl. .............. 257/27; 257/213; 257/E29.02
(58) Field of Classification Search ............ 257/25, 257/27, 213, 977, 18, E51.04, E51.005; 324/158.1; 977/762, 781
See application file for complete search history.

(56) References Cited

U.S. PATENT DOCUMENTS

| | | | |
|---|---|---|---|
| 6,297,063 B1 | 10/2001 | Brown | |
| 6,972,467 B2 * | 12/2005 | Zhang et al. | 257/401 |
| 6,998,634 B2 * | 2/2006 | Cheong et al. | 257/9 |
| 7,102,157 B2 | 9/2006 | Kastalsky | |
| 7,151,209 B2 | 12/2006 | Empedocles | |
| 2002/0172820 A1 | 11/2002 | Majumdar et al. | |
| 2003/0122133 A1 | 7/2003 | Choi et al. | |
| 2004/0044235 A1 | 3/2004 | Cheron et al. | |
| 2004/0058153 A1 | 3/2004 | Ren et al. | |
| 2005/0056877 A1 * | 3/2005 | Rueckes et al. | 257/300 |
| 2005/0161662 A1 | 7/2005 | Majumdar et al. | |
| 2005/0167755 A1 | 8/2005 | Dubin et al. | |
| 2005/0230270 A1 | 10/2005 | Ren et al. | |
| 2006/0169972 A1 | 8/2006 | Furukawa et al. | |
| 2006/0220141 A1 | 10/2006 | Besser | |
| 2007/0032051 A1 | 2/2007 | Lieber et al. | |

* cited by examiner

*Primary Examiner*—Roy K Potter
(74) *Attorney, Agent, or Firm*—Woodcock Washburn, LLP

(57) ABSTRACT

The Nanotube Array Ballistic Transistors are disclosed, wherein the ballistic (without collisions) electron propagation along the nanotubes, grown normally to the substrate plane on the common metal electrode, is used for a new class of hybrid (solid state/vacuum) electronic devices. In the disclosed transistors, the array of nanotubes emits electrons into vacuum when electrons gain sufficient energy inside the nanotubes due to ballistic electron movement under the voltage applied to the nanotube ends.

In the disclosed devices, planar layer deposition technology is used to form multilayer structures and attach two electrodes to the nanotubes ends.

The ballistic transistor can also be used for making a new type of electron-emission display when a phosphor layer is deposited on the anode electrode.

The non-ballistic nanotube array transistor, employing field-induced electron emission and the same planar layer deposition technique, is also disclosed, the device being considered to be a transistor approaching terahertz frequency range of operation.

14 Claims, 6 Drawing Sheets

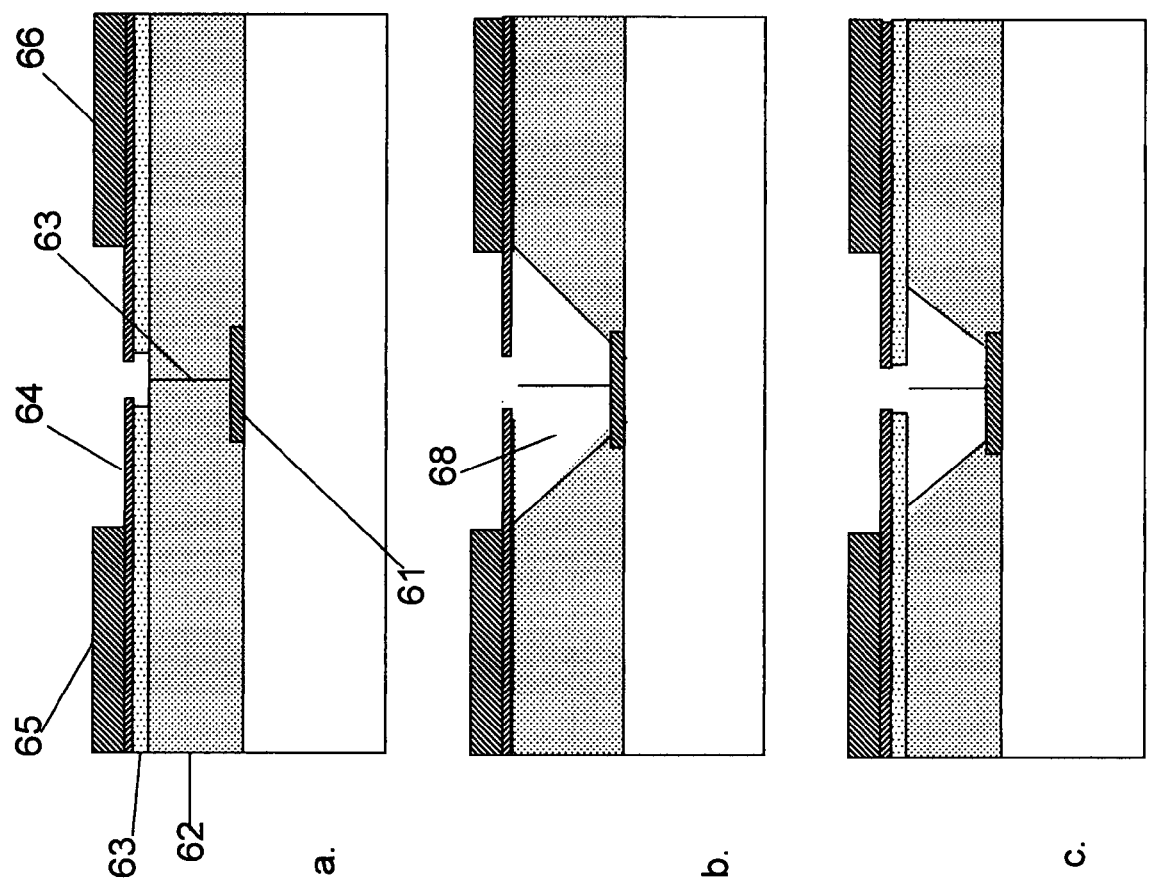

NANOTUBE ARRAY ELECTRONIC DEVICES

FIELD OF THE INVENTION

The invention relates to carbon nanotube array ballistic electron sources, as well as transistors and diodes employing array of grown nanotubes.

BACKGROUND OF THE INVENTION

The carbon nanotubes (CNT) possess unique properties due to extremely small nanotube diameter (~1 nm for a single walled CNT,) which gives rise to a strong two-dimensional quantization of the energy spectrum. As a result, the electron scattering is largely suppressed and the electrons move along the nanotube ballistically, i.e. without collisions and loss of energy, while the nanotube resistance is essentially controlled by the contact resistances. The minimum contact resistance is determined by the quantum contact resistance of 6.5 kOhm (per contact).

In the previous patent U.S. Pat. No. 7,102,157, the ballistic electron propagation along the nanotube was utilized to disclose a vacuum electron emitter, in which electrons under the potential difference between the contacts V approaching the $\phi/e$, where $\phi$ is the nanotube work function (~4.7 eV for CNT), will be able to escape into vacuum and be collected with the external electrode (anode).

It should be emphasized that the physical meaning of the ballistic transport is more stringent than simple preservation of the electron energy, which is needed for the invented devices, according to the present invention. It requires a phase coherent resonance for electron propagation, like a Fabry-Perot resonance for the light propagation in the laser, see e.g. W. Liang et al, Nature, 411,665, 2001; or J. Kong et al, Phys. Rev. Lett. 87,106801, 2001. In the disclosed devices, the elastic electron scattering, such as impurity scattering affecting the electron phase, is not important since it does not change the electron energy. In the description below, the "ballistic" electron transport implies only the energy conservation during the electron movement within the nanotube.

FIG. 1 illustrates as a Prior Art the ballistic mechanism of electron escape into vacuum discussed in the above cited patent. A CNT is placed between two contacts, which form the emitter circuit. FIG. 1a shows the energy band diagram. The contacts are shown as potential barriers in conjunction with electron reservoirs of the metal electrodes, while the CNT is shown as a low electron density semiconductor 90. The applied voltage V, see FIG. 1b, is distributed across the input and output contacts as $V_{in}$ and $V_{out}$ respectively, according to the resistance of the barriers. The electrons tunnel through the input barrier into the nanotube and move ballisticaly (i.e. without energy loss) through high energy states to the positively biased output contact. This implies that electrons gain the energy $eV_{in}$. It is preferable to make the tunneling resistance of the input contact much higher than that of the output contact, i.e. $V_{in}/V_{out} \gg 1$. Then almost entire applied voltage V will drop across the input contact, V~Vin. If this energy exceeds the work function $\phi$, the electrons at this contact are ready to escape into vacuum and can be extracted with the anode voltage Va>V. It was assumed however that for high energy electrons there is large probability of electron energy relaxation due to electron-phonon and electron-electron interactions, so that only a fraction of electron will be able to escape into vacuum.

Strongly quantized energy spectrum of the nanotubes due to extremely small nanotube diameter dramatically suppresses the electron-phonon interaction thereby making ballistic electron propagation possible. At present, there is a lot of evidence for the ballistic electron movement in the SWNT, both at low voltages (see e.g. W. Liang, et al, Nature 411, 665, 2001 for metallic nanotubes and A. Javey et al, Nature, 424, 654, 2003 for semiconducting SWNT) and at higher voltages, see e.g. Z. Yao et al, Phys. Rev. Lett. 84, 2941, 2000. In the latter article, the mean free path of the high energy electrons for the backscattering optical phonon emission in SWNT, $l_o$, was estimated to be very large reaching ~100 nm. This implies that for the nanotube of a length comparable to $l_o$ there is a large probability for the electron escape into vacuum.

In the cited above publication by A. Javey et al, a ballistic field-effect transistor was described, wherein the ballistic electron propagation between source and drain contacts on the CWNT was modulated by the gate electrode. The contacts to the nanotube were made with palladium (Pd) which minimizes the contact resistance to its quantum limit of 6.5 KOhm. Other metals form a Schottky barrier with the nanotube, with the tunneling resistance varying in a large range, typically from 10 KOhm to 1 MOhm. In the foregoing publication by A. Javey et al, the field-effect transistor, although also relying on the ballistic electron movement along the nanotube, does not employ electron escape into vacuum, as discussed in the disclosed below ballistic transistors. It should also be emphasized that the ballistic mechanism for electron emission, according to the present invention, is fundamentally different from the field induced electron escape from the nanotube, wherein the tip serves as a concentrator of the electric field, while the nanotube itself represents merely a conductor.

In the cited above U.S. Pat. No. 7,102,157, the ballistic device is made as a single nanotube placed on the insulating substrate and endowed with two contacts at the nanotube ends, see FIG. 2 (Prior Art). In this configuration, parallel placement of multiple identical nanotubes to enhance the output current requires a special manipulator and seems impractical for the device manufacturing. It would be therefore preferable to grow a controllable nanotube array on a metal electrode normally to the electrode plane and then attach a second common contact to all the nanotube tips.

Such a design was partially disclosed by Z. F. Ren et al. in the US patent application # US 20040058153 A1 for fabrication of the field-emission cathode. In this design, the grown nanotubes were covered with an insulating layer, and nanotube ends protrude above this layer. Then the top side is polished to cut off the nanotube ends thus exposing the tips of the nanotubes. The nanotube array in the Ren's patent application was used solely to produce a diode-like cathode-to-anode structure for the field-induced electron emission from the nanotube into vacuum due to electric field focusing at the nanotube tips. Neither second contact to the nanotube tips nor ballistic electron movement along the nanotubes are discussed there.

In the below disclosed designs, according to the present invention, a second contact is placed on the insulator layer covering the nanotubes and is connected to the nanotube tips, thereby forming, together with the bottom electrode and the external anode electrode, a three-terminal hybrid (solid-state/vacuum) device structures suitable for producing an output, anode, current due to the ballistic electron emission from the nanotube. All the nanotube tips covered by the top contact equally participate in the emission process thereby multiplying the output current.

Several different ballistic device embodiments are disclosed below. In all of them, the multilayer device structure with the flat platform for the second nanotube contact allow fabrication of the nanotube arrays with extremely short nanotube length, which is necessary for obtaining a sizable ballistic electron emission effect.

The last disclosed nanotube array electronic device is based on similar technique for making a flat platform at the nanotube tip but has non-ballistic nature for the electron emission. This is the only disclosed device which relies on the field-induced electron emission from the nanotube tips.

BRIEF DESCRIPTION OF THE INVENTION

To build a nanotube array ballistic transistor (NABT), according to the present invention, one has to provide two contacts to each nanotube in the array. The first contact is made as a metal electrode deposited on an insulating substrate, like glass. It is followed by deposition on the metal electrode of small pads of a catalytic metal, such as Ni, Co or Fe, to facilitate the nanotube growth. The growth of single walled nanotubes is preferable for the NABT, since they have the strongest quantum size effect and therefore maximum energy separation between the quantum levels. Such nanotubes are best suited for the one-dimensional ballistic electron flow since strong quantization suppresses electron energy relaxation.

After nanotube growth, a dielectric layer, such as $SiO_2$, is deposited on the substrate. The dielectric thickness must be slightly lower than the nanotube length, so that the nanotube ends protrude above the dielectric film. To remove these ends, the substrate is polished, thereby creating exposed tips of the nanotubes on a flat platform, ready for further device processing.

A metal film is then deposited onto exposed nanotube ends to provide a second contact to all the nanotubes in the array. This second contact to the device serves as a gate electrode to control the electron emission into vacuum. The third electrode is made as an anode metal pad, aside from the second electrode and separated from it with a vacuum gap.

In another NABT embodiment, the second contact to the nanotube is made on the nanotube side, thus leaving the nanotube end exposed. The removal of the metal layer from the nanotube tip eliminates the problem of the electron energy losses within this layer prior to the electron escape into vacuum.

In the third NABT embodiment, the phosphor layer is deposited on the anode electrode to produce light under the electron bombardment. This design is suitable for making a new ballistic electron-emission display with a low threshold voltage for the electron emission. The fourth NABT embodiment employs a second gate electrode attached through the insulator to a side wall of the nanotube. This insulated gate allows additional output current modulation, besides the original gate electrode on top of the nanotubes. The design with the insulated gate is preferable for fabrication of the Integration Circuits using the NABT as an active element.

Finally, the fifth disclosed electronic device, unlike all the foregoing devices, relies on the field-induced electron emission into vacuum. As in previous devices however, the processing of such a Nanotube Array Field Emission Transistor (NAFET) is also based on planar multilayer deposition technique which provides a flat platform at the second nanotube tip. In this device, due to extremely small tip-to-gate distance of ~0.1 μm, one can obtain very high transistor trans-conductance and therefore very high device speed.

DETAILED DESCRIPTION OF THE INVENTION

1. The NABTs

Figure 1:
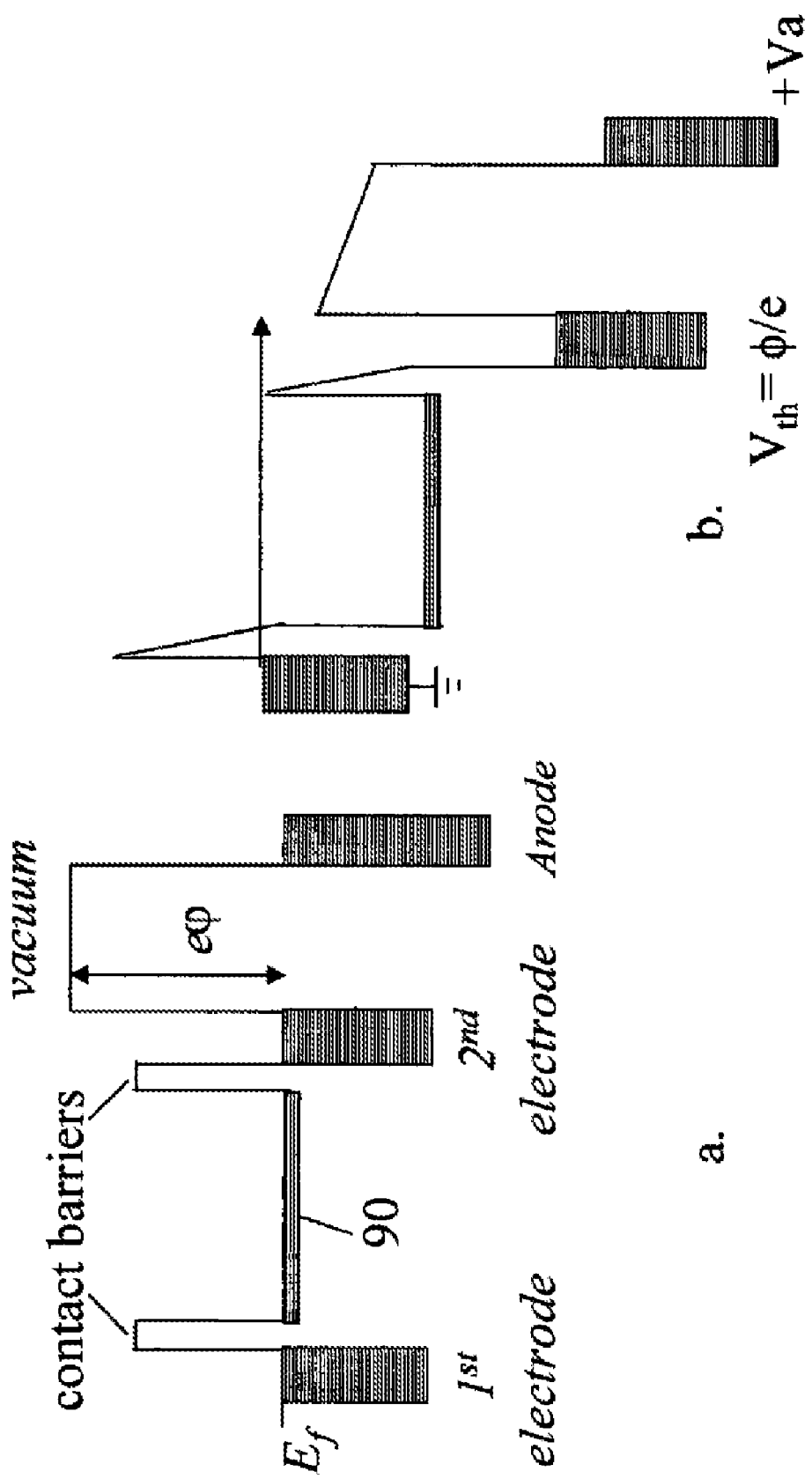
FIG. 1 illustrates the ballistic mechanism of electron escape in vacuum discussed in U.S. Pat. No. 7,102,157.
Figure 2:
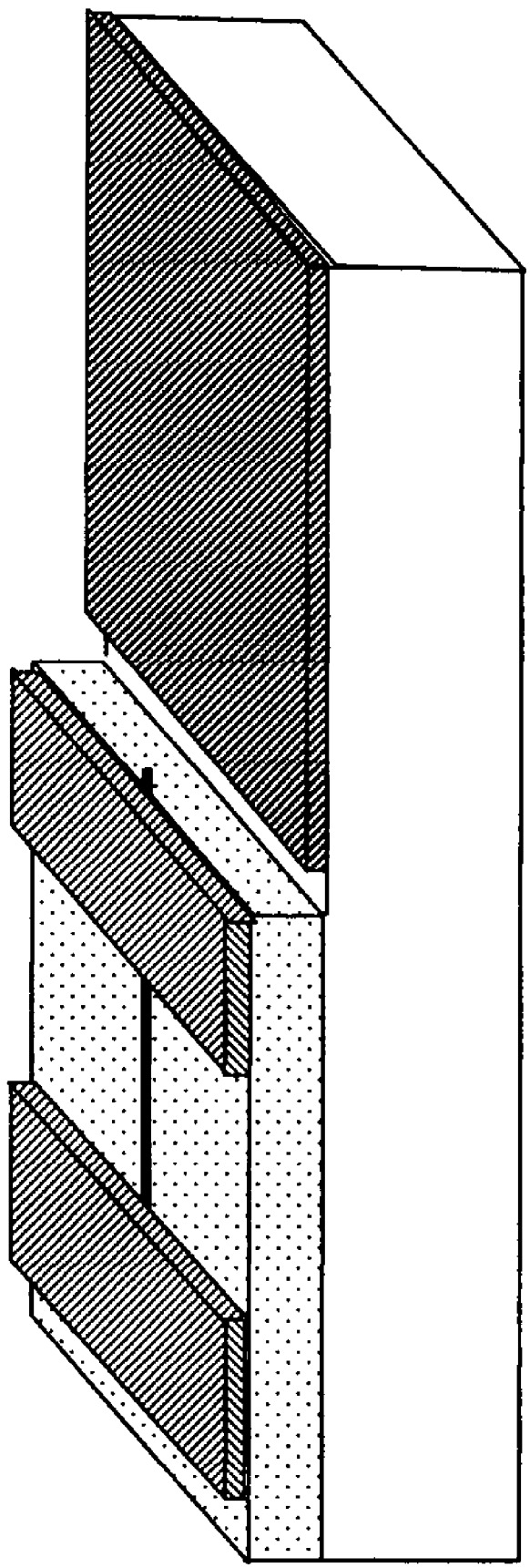
FIG. 2 shows the configuration of the ballistic device as described in U.S. Pat. No. 7,102,157.

FIG. 3*a* shows the cross-sectional view of the NABT structure. The device is made on the insulating substrate (glass) 31 using planar layer deposition technology. The first metal layer 32 is deposited in the shape of a stripe (normally to the drawing plane) and serves as a cathode electrode, on which the nanotube array will be grown. Before the nanotube growth, small pads of catalytic material (not shown), such as Ni, Fe or Co, are deposited on the metal layer 32 to activate the process of growth. After the nanotube growth, an insulator film 36, such as $SiO_2$ or SiOx, having the thickness smaller than the nanotube height, is deposited. It is followed by polishing of the top surface to cut off the nanotubes ends and thus to both expose the nanotube tips and provide a flat platform for further processing. The grown nanotubes are shown in FIG. 3*b* as a linear array 33 normal to the substrate plane.

The next processing step is unique, since it relates to formation of the second common electrode to the nanotubes. A metal film 37, see FIGS. 3*a,b*, is deposited to provide the second, output, contact to all nanotubes. This layer must be sufficiently thin to minimize the electron energy losses before escaping into vacuum. On the other hand, the metal film 37 must be continuous to ensure a reliable contact. It is preferable to make this metal film from Pd, which provides the minimum, quantum, contact resistance to the nanotube. A thick metal layer 38 is then deposited on top of the thin film 37 in close proximity but aside from the nanotube tips to provide the second common electrode to all the nanotubes.

The same platform 36 is used to form the anode electrode 39. All three device electrodes practically do not overlap with each other, as seen in FIG. 3*b*, thereby minimizing the device inter-electrode capacitances. The second electrode 38 operates essentially as a gate to control the emission current to the anode when sufficient voltage is applied to the second electrode relative to the cathode electrode to activate a high energy electron tunneling into the nanotube and ballistic propagation along the nanotube. The total device output (anode) current is a sum of the anode currents from all the nanotubes in the array covered by the gate contact 37. Comparison of the gate and the anode currents would characterize the ballistic current component and the device emission efficiency.

It is practical for the NABT operation to make the injection contact 32 and the output contact 37 to the nanotubes of different tunneling transparency. The lowest contact resistance for the nanotubes, which is controlled by the quantum contact resistance of 6.5 KOhm (per contact), can be made using Palladium as a contact metal, see e.g. A. Javey et al, Nature, 424, 654, 2003. If for example, both contacts are made of Pd metal and provide the total, quantum, contact resistance R of 13 KOhm, then at voltage V~10V, equally dropping across the two contacts, the current I along the nanotube I=V/R~0.8 mA is too high to be sustained by the nanotube. To minimize the current it is therefore preferable to make the resistance Ri of the electron injection contact 32 much higher then that of the resistance Ro at the output contact 37, i.e. Ri>>Ro. The metal layer 32 plays the role of a Shottky contact with a high tunneling resistance. To adjust the tunneling resistance of the cathode electrode, and if necessary, to make this resistance even higher, a thin (~10 nm) layer of insulator, such as $SiO_2$, can be deposited on top of this metal layer 32 (not shown), prior to the deposition of the catalytic pads.

Figure 3:
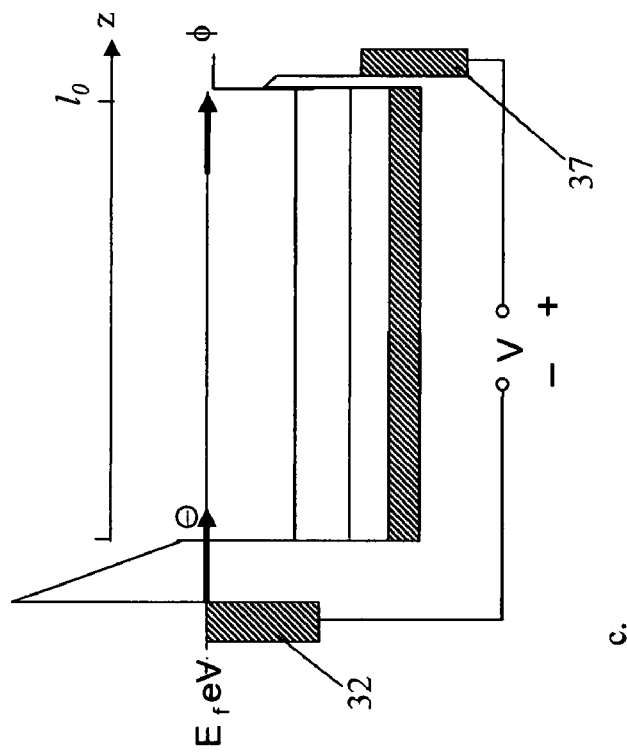
FIG. 3 illustrates cross-sectional (a) and top (b) views of the NABT.
Figure 3:
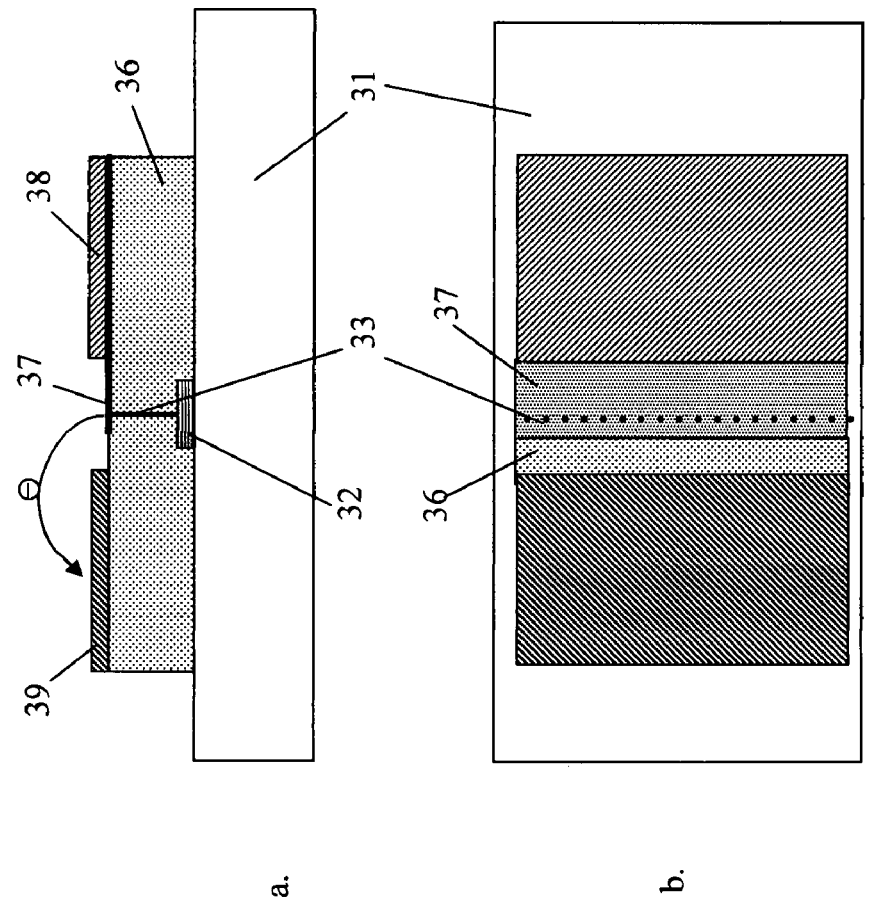

FIG. 3c shows the energy band diagram for this case. The output contact 37 is made from Pd metal and has the lowest, quantum, resistance Ro=6.5 KOhm, which is indicated in FIG. 3c by a thin tunneling barrier at the electron emission end. The input resistance Ri is chosen to be much higher, Ri>>Ro, which is indicated by a thicker tunneling barrier at the electron injection contact 32. If Ri is chosen to be in the range of Ri~1 MOhm, then the entire applied voltage V drops predominantly across this contact. In this case, the electron energy at the injector V=$\phi$/e~5V would be sufficient for the ballistic electron emission from the output contact to the anode, while the nanotube current I=V/Ri~5 µm would be sustainable by short nanotubes, see A. Javey et al Nature, 424, 654, 2003. In accordance with this approach, the thin top contact layer 37 in FIG. 3 should be made from ~10-15 nm-thick Pd layer.

The nanotube portion of the energy diagram in FIG. 3c is shown as a conducting media with the energy spectrum containing several quantum levels, which result from the size quantization. It is worth emphasizing that, unlike conventional semiconductor heterostructure barriers and quantum wells where electrons tunnel in the direction of energy quantization, i.e. normally to the barrier/quantum well plane, in the disclosed devices the energy is quantized in the directions normal to the nanotube axis, while the electrons tunnel and travel along the nanotube in the third, non-quantized, z-direction. This implies that the quantum levels in the nanotube, shown in FIG. 3c, do not produce resonant conditions for tunneling. Only the density of states in the direction z of the nanotube axis contributes to the resonance: it has a maximum at the quantum level and then decays with the electron energy E as $\sim 1/E^{1/2}$, see e.g. High-speed semiconductor devices, J. Wiley & Sons, p. 98, 1990.

This implies that at any particular quantum level its density of states exhibits a peak, while the density of states extending to this level from energetically lower quantum levels will be significantly reduced. In addition, the electrons at the Fermi level $E_f$, see FIG. 3c, have the highest tunneling probability, since for electrons below the Fermi level the barrier height is higher and hence, tunneling probability is lower. Both these features provide resonant conditions for electron tunneling from the Fermi level into a chosen quantum level: electrons will tunnel within a narrow energy range mainly into this level. If the quantum level energy is close to the electron work-function value of $\phi$~4.7 eV, then the electrons traveling at this energy level will have a reasonable probability to escape into vacuum, when the nanotube length is comparable with the ballistic mean free path $l_o$. Such resonant conditions are illustrated in FIG. 3c.

Figure 4:
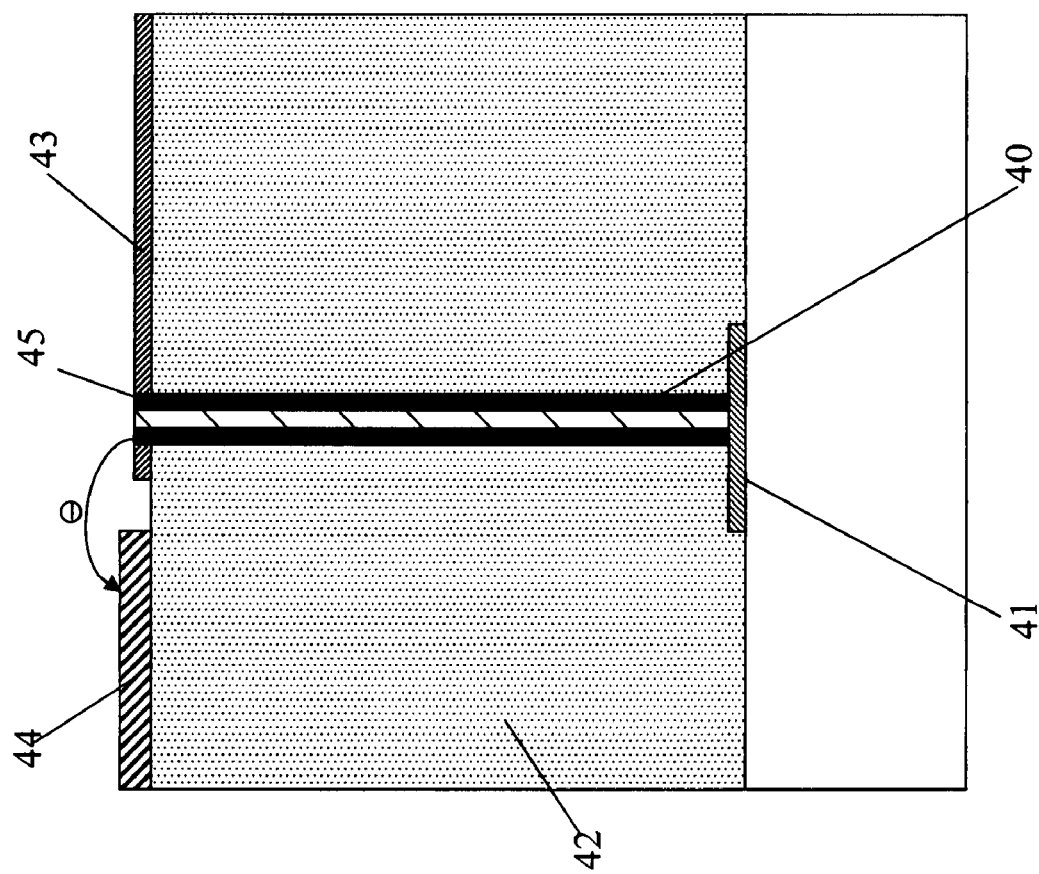
FIG. 4 shows cross-sectional view of the NABT with a second contact made on the nanotube side.

FIG. 4 shows another NABT embodiment, where the top contact to the nanotubes is made on the nanotube wall, aside from the nanotube tip, thereby removing the adverse effect of electron energy losses in the top contact layer 37 of FIG. 3a. In FIG. 4, the nanotube 40, grown on the metal layer 41, is shown as a narrow vertical cylinder immersed into the insulator layer 42. Originally, the thickness of this layer is smaller than the nanotube height, so the nanotube ends protrude above the top surface of the insulator 42. Prior to cutting off the nanotube ends, the nanotubes are slightly etched to remove a thin insulator layer, which covers the nanotube walls after deposition of the insulator layer 42. Then a metal layer 43 is deposited (sputtered) on top of the insulator layer 42, thus making a side contact around all the nanotubes. As discussed before, the Pd metal is preferable for this contact. After surface polishing and removal of the nanotube ends, each exposed nanotube cylindrical edge 45 with attached contact 43 on the side of the nanotube becomes a metal-free ballistic electron source when the voltage V≧$\phi$/e is applied to the output contact 43 relative to the injecting contact 41, and a higher voltage Va>V is applied to the anode electrode 44. The anode electrode 44 is deposited on the same top surface of layer 42 as the metal layer 43.

The efficiency of electron escape into vacuum depends on the work function energy $\phi$ of the emitting material. Lowering the work function for electron emission is expected to dramatically increase the output emission current. For this purpose, deposition of a mono-layer of such materials as Cs, $Cs_2O$ or $Cs_2Te$ on top of the exposed nanotube tips 45 in FIG. 4 would be beneficial for the device performance, since these materials are known to reduce the work function of the CNT for electron escape into vacuum from its original value of ~4.8 eV to ~2.5 eV, see S. Suzuki, et al in Appl. Phys. Lett. 76 (26) (2000), p. 4007. In this case, the threshold voltage for the electron emission will be lowered, and much higher emission current is expected at the same gate voltage.

It is important that electron velocity both along the nanotube and in vacuum is ~20-30 times (depending on the applied voltages) higher than typical saturated electron velocity in semiconductors $\sim 1.10^7$ cm/s. Therefore, one can expect that the NABT speed will be significantly higher than that in the semiconductor devices with similar electron propagation dimension, such as a gate length in the FET. On the other hand, it would be practical to combine the NABT with conventional electronics made on Si wafer. For this purpose, the NABT can be made on Si wafer and then coated with a protective dielectric layer prior to fabrication of the Si-based circuitry. In the opposite approach, the Si circuitry can be built first to be followed by the NABT fabrication.

The disclosed device can be used not only as a new hybrid high-speed transistor. The electrons emitted into vacuum can be utilized in an electron-emission display when a phosphor layer is placed on the anode electrode to emit light in response to the electron activation. Low expected control voltages allow incorporation of the TFT circuitry into the display to provide functions "pixel select" and "pixel hold". The latter function implies pixel memory and therefore high display brightness.

The fundamental difference of the ballistic electron emission devices, disclosed in the present patent, from conventional nanotube field-emission devices, relying on the electron field focusing at the nanotube tip, results in different device designs. Since in the cold cathodes mutual nanotube field screening is important factor in lowering the resultant electric field at the nanotube tips and therefore in reduction of the nanotube emission efficiency, the distance between the neighboring nanotubes must be comparable or larger then the nanotube height, see e.g Y. Cheng and O. Zhou in C.R. Physique 4, (2003), p. 1021. This poses a limitation to the nanotube density and therefore to the output current amplitude. In the ballistic approach, the electric field concentration at the tip does not play any role in the emission process. This implies that in the NABT the nanotube density can be very high which results in a high output current. For example, for the nanotube array with a pitch of 1 µm at achievable current amplitude of 10 μA per nanotube, one obtains the nanotube current density of 1000 A/cm². With a realistic value of 10% of electron emission efficiency, one obtains the anode current density of 100 A/cm².

Another important factor for ballistic electron emission mechanism is the nanotube length. For the conventional nanotube cold cathodes, it is beneficial for the electron emission efficiency to have relatively long nanotubes, at least above 1 μm. On the contrary, in the ballistic device, to minimize possible electron energy losses, it is preferable to keep the nanotubes length as short as possible, comparable with or shorter than the electron energy relaxation length $l_o$. As pointed out earlier, the nanotube length of 100 nm would be comparable with the electron ballistic mean free path, so that a sizeable fraction of electron is expected to escape into vacuum. The disclosed planar layer deposition technology allows fabrication of the arrays with any predetermined nanotube density and length.

Figure 5:
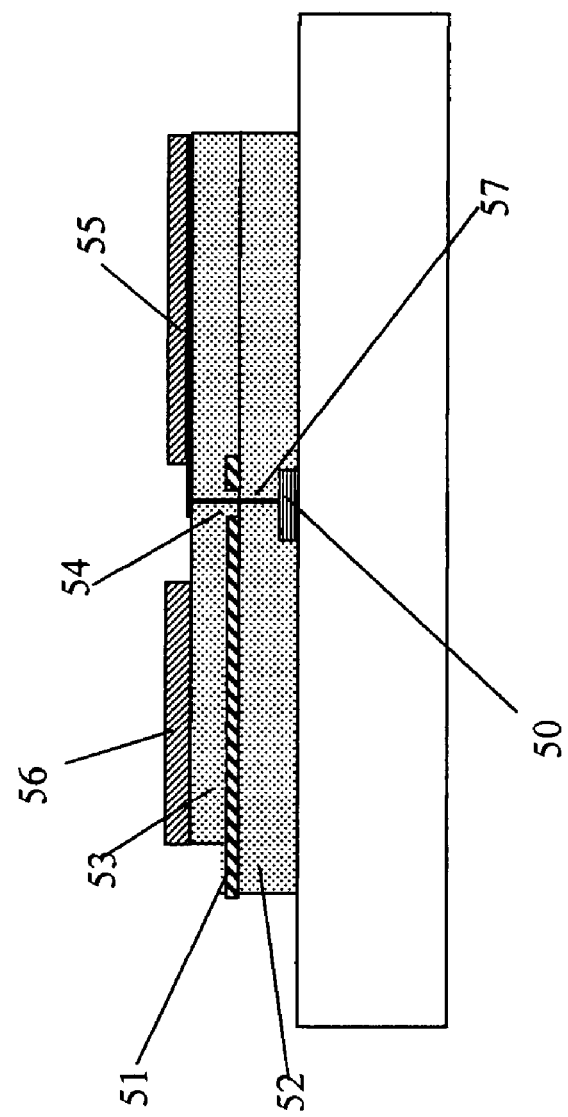
FIG. 5. shows four-terminal version of the NABT, with additional insulated gate electrode on the side of the nanotube FIG. 6. shows the cross-sectional views of the NAFET structures.

In the above discussed NABT designs, shown in FIGS. 3 and 4, the second electrode serves as a gate to modulate the output anode current, and the gate has a low cathode-to-gate resistance. This poses a problem for designing more complex circuits using the NABT: like in a regular FET-based circuit, it is preferable to have the gate electrode electrically insulated from the conductive channel. FIG. 5 shows a cross-sectional view of another version of the NABT, in which the second gate electrode 51 is attached to the sidewall of every nanotube 57 in the array through a layer of insulator 54. The device processing steps are essentially similar to those used for the previously discussed NABT embodiments. The key new element is the additional metal layer 51 in the middle of the nanotube length, sandwiched between two insulator layers 52 and 53. During deposition of the first insulator layer 52, a thin layer of insulation material will also be deposited on the nanotube walls, thereby forming a gate insulator layer 54. It is then followed by deposition of the metal layer 51 and the insulator layer 53. The metal layer 51 surrounding the insulator layer 54 in every nanotube in the array, represents the insulated gate electrode to the nanotube, to lower the electron concentration in the nanotubes when a negative voltage is applied to this electrode relative to the cathode electrode 50.

The design in FIG. 5 represents a four-electrode version of the NABT with two controlling gate electrodes 51 and 55 common to all nanotubes in the array, the gate electrode 51 having advantage of being insulated from the nanotubes. The forth, anode, electrode 56 completes the structure. In this design, the output, anode current modulation can be accomplished through voltage variation at the insulated gate 51, while keeping the resistive gate electrode 55 at a positive potential exceeding the ballistic emission threshold. On the other hand, the nanotubes with three electrodes 50, 51 and 55 form an independent non-vacuum nanotube-based ballistic transistor, wherein the current, modulated by the common to all nanotubes gate electrode 51, reaches the second electrode 55 without entering vacuum space. In this mode of operation, the anode electrode can be either biased or disconnected.

2. The NAFET

Unlike the previously discussed electronic devices, shown in FIG. 3-5, the NAFET relies on the field-induced electron emission into vacuum, while the fabrication method is similar to that used in the foregoing devices. FIG. 6 shows three device embodiments. As in the NABT, the nanotube array is grown on the metal stripe 61 and then coated with a dielectric film 62, see FIG. 6a. After polishing this film to remove the nanotube ends and expose the nanotube tips, another, ~0.1 μm-thin, dielectric layer 63 is deposited on the film 62 and the nanotube tips. It is followed by deposition of a thin metal film 64, with two separate electrodes 65 and 66 on top of it.

A narrow, ~0.1-0.2 μm-wide, opening 66 is then etched in both the metal film 64 and dielectric layer 63 along the nanotube array, thereby separating the metal film 64 into two electrically isolated pieces. Selective etching of the layer 63 stops at the dielectric film 62 and exposes the nanotube tips, thereby making a three terminal device. Voltage applied between the bottom electrode 61 (cathode) and one of the top electrodes, say, electrode 65 (anode), separated by a short distance of ~0.1 μm from the nanotube tip, provides field electron emission with the expected threshold of much less than 1V, while the opposite top electrode, 66, serves as a gate to modulate the anode current when a voltage is applied to it relative to the cathode.

FIG. 6b shows another device embodiment, where the layer 63 is absent and the dielectric film 62 is etched around the nanotube, thereby providing an air space 68 around the tip. In this case, the tip position reaches the metal plane. This design can be beneficial since dielectric coating around the nanotube tip shown in FIG. 6a, can lower the electric field strength at the tip and therefore increase the emission threshold. There is however a potential danger that the nanotube tip is located too close to the metal film, and any declension of the nanotube from vertical direction can cause a short with the metal film. FIG. 6c shows a third design, which is identical to that of FIG. 6a, except for the dielectric film 62 which is etched around the nanotube, as in the design of FIG. 6b. In this case, the tip position is lowered by the thickness of the film 63 which eliminates any possibility of a short.

Very small gate-to-tip and anode-to-tip distances of ~0.1-0.2 μm, makes the NAFET unique in many respects:

1. The estimates show that the NAFET can exhibit an extremely high frequency of operation due to high transistor transconductance g and unique contact geometry. For the nanotube current of 10 μA which can be modulated by the gate voltage Vg=1V, one has the transconductance g~10 μA/1V~$10^{-5}$ S. Having the active area A for the gate and cathode electrode of A=1 μm² per one nanotube, one obtains for the nanotube length of L=3 μm the input capacitance C~0.1 A/L F~$3 \times 10^{-8}$ F. This yields the characteristic device response time τ=C/g=$3 \cdot 10^{-13}$ s, which implies that the transistor reaches the terahertz frequency range of operation.

2. Negative gate voltage results in a lowering of the anode current and nullifies the electron current to the gate, thus making the gate electrically isolated from the nanotube. As discussed above, the electrically isolated gate is important feature for producing integration circuits. However, if this feature is not an important factor, one can apply a positive gate voltage and even higher anode voltage to move the majority of electrons toward the anode.

3. The inter-electrode distances of ~0.1-0.2 μm is shorter than the mean free path L for electrons in the atmosphere (L~0.7 μm). This implies that the electron flow in the air becomes essentially undisturbed by collisions with atoms and thus allows the device operation without vacuum.

4. The device can operate as a high-frequency diode if only two contacts, namely, the bottom contact 61 and one of the top contacts 65 or 66 are used.

5. Both diode and transistor versions can operate at high temperatures, since the field-emission mechanism is essentially temperature independent, in contrast with the Si-based electronics where the temperature range is limited by ~85° C.

Thus, the disclosed invention provides unique technology for manufacturing of the nanotube-based ballistic transistors, all of them having array of multiple and controllable number of the nanotubes. The utilized planar fabrication technique offers a method of mass production of high-speed hybrid electronic devices. The NABT, with phosphor layers deposited on the anode electrodes, can be used for fabrication of the ballistic electron-emission vacuum displays. Finally, one non-ballistic device version, the NAFET, employing the field-emission mechanism of the electron emission, is disclosed as potentially most efficient and fast electronic transistor.

I claim:

1. The nanotube array ballistic transistor, comprised of the following components:
   dielectric substrate;
   first conducting electrode, the cathode, deposited on said substrate;
   array of carbon nanotubes grown on said first conducting electrode normally to the substrate plane;
   dielectric film covering said carbon nanotubes, said dielectric film being thinner than the height of said carbon nanotubes, so that after deposition of said dielectric film the ends of said carbon nanotubes protrude beyond said dielectric film;
   thin metal layer deposited on the exposed nanotube tips, said nanotube tips becoming exposed after polishing the surface of said second dielectric film and thus removing protruded nanotube ends;
   second conductive electrode, the gate, deposited on said dielectric film aside from said nanotube tips and in electrical contact with said thin metal layer;
   third conducting electrode, the anode, deposited on said dielectric film, aside from both said nanotube tips and said second conductive electrode,
   device housing made over said ballistic transistor to provide vacuum in the device active volume.

2. The nanotube array ballistic transistor, as in claim 1, wherein the nanotubes are single walled.

3. The nanotube array ballistic transistor, as in claim 1, wherein said thin metal layer is a film of Pd, 10-15 nm-thin.

4. The nanotube array ballistic transistor as in claim 1, wherein said first conductive electrode is made from the metal having a high-resistive tunneling barrier to the nanotubes.

5. The nanotube array ballistic transistor as in claim 1, wherein a thin dielectric film is deposited between said first conductive electrode and the nanotube to further increase the tunneling resistance of said high-resistive tunneling barrier.

6. The nanotube array ballistic transistor, comprised of the following components:
   dielectric substrate;
   first conducting electrode, the cathode, deposited on said substrate;
   nanotubes grown on said first conducting electrode normally to substrate plane;
   dielectric film covering said nanotubes, said dielectric film being thinner than the height of said nanotubes, so that after deposition of said dielectric film the ends of the nanotubes protrude beyond said dielectric film;
   second conductive electrode, the gate, deposited on said dielectric film after partial etching of said dielectric film to remove a dielectric coating from the nanotube sidewalls, so that said second conductive electrode makes electrical contact to each nanotube around its side surface, thereby creating a common side contact to all the nanotubes, while the subsequent polishing of the device surface removes the protruded nanotube ends and thus leaves all the nanotube tips exposed;
   third conducting electrode, the anode, deposited on said dielectric film, aside from said second electrode;
   device housing over said ballistic transistor to provide vacuum in the device active volume.

7. The nanotube array ballistic transistor, as in claim 6, wherein a mono-layer of material having low work function for electron escape into vacuum is deposited on the exposed nanotube tips.

8. The nanotube array ballistic transistor, as in claim 7, wherein said materials having low work function are Cs, $Cs_2O$ or $Cs_2Te$.

9. The nanotube array ballistic transistor as in claim 1, wherein said third conductive electrode, the anode, is covered with a phosphor layer to produce light under electron bombardment and thereby provide the mechanism for ballistic electron-emission display.

10. Four-terminal nanotube array ballistic transistor, comprised of the following components:
    dielectric substrate;
    first conducting electrode deposited on said dielectric substrate;
    carbon nanotubes grown on said first conducting electrode normally to substrate plane;
    first dielectric layer coating both said first conductive layer and the nanotube sidewalls, the thickness of said first dielectric film being approximately equal to a half of the nanotube height;
    metal layer of the additional conductive electrode deposited on said first dielectric layer, said metal layer of additional conductive electrode being attached to the nanotubes sidewalls over said first dielectric layer coating said nanotube sidewalls, thereby providing an insulating gate electrode to the nanotubes;
    second dielectric film deposited on said additional conductive electrode, the total thickness of said first dielectric film, said additional conductive electrode and said second dielectric film being thinner than the nanotube height, so that the nanotube ends protrude above said second dielectric film;
    thin metal layer deposited on the exposed nanotube tips, said nanotube tips becoming exposed after polishing the device surface and thus removing the protruded nanotube ends;
    second conductive electrode, the gate, deposited on said dielectric film aside from said nanotube tips and in electrical contact with said thin metal layer;
    third conducting electrode, the anode, deposited on said dielectric film, aside from both said nanotube tips and said second conductive electrode.

11. A non-ballistic nanotube array transistor comprised of the following components:
    dielectric substrate;
    first conducting electrode deposited on said dielectric substrate;
    carbon nanotubes grown on said first conducting electrode normally to substrate plane;
    first dielectric film covering said carbon nanotubes, said dielectric film being thinner than the height of said carbon nanotubes, so that after deposition of said dielectric film the ends of said carbon nanotubes protrude beyond said dielectric film;
    second dielectric layer deposited on the exposed nanotube tips, said nanotube tips becoming exposed after polishing the surface of said first dielectric film and thus removing protruded nanotube ends;
    second metal film deposited on said second dielectric layer, said second metal film being separated into two electrically isolated metal sides when a narrow notch is etched in said second metal film and said second dielectric layer along the nanotube array, thereby dividing said second metal film into two electrically insulated pieces and exposing the nanotube tips;

the gate metal electrode is deposited on one of said electrically insulated piece, away from the nanotube array;

the anode metal electrode is deposited on another said electrically isolated piece, away from the nanotube tips.

12. The non-ballistic nanotube array transistor as in claim 11, wherein the width of said narrow notch in said second metal film is less than or close to 0.2 μm.

13. The non-ballistic nanotube array transistor as in claim 11, wherein said second dielectric film is 0.1 μm-thick.

14. The non-ballistic nanotube array transistor as in claim 11, wherein said first dielectric layer is partially etched around the nanotubes to provide an open space around the nanotube tips.

* * * * *